(12) United States Patent
Pell et al.

(10) Patent No.: US 8,847,798 B2
(45) Date of Patent: Sep. 30, 2014

(54) SYSTEMS AND METHODS FOR DATA COMPRESSION AND PARALLEL, PIPELINED DECOMPRESSION

(71) Applicant: Maxeler Technologies Ltd., London (GB)

(72) Inventors: Oliver Pell, London (GB); Stephen Girdlestone, London (GB); Henning Meyer, London (GB)

(73) Assignee: Maxeler Technologies, Ltd., London (GB)

( * ) Notice: Subject to any disclaimer, the term of this patent is extended or adjusted under 35 U.S.C. 154(b) by 0 days.

(21) Appl. No.: 13/717,188

(22) Filed: Dec. 17, 2012

(65) Prior Publication Data

US 2014/0167987 A1    Jun. 19, 2014

(51) Int. Cl.
*H03M 7/30* (2006.01)
*H03M 5/14* (2006.01)

(52) U.S. Cl.
CPC .................................. *H03M 5/145* (2013.01)
USPC ............................................. 341/87; 341/67

(58) Field of Classification Search
CPC ....................................................... H03M 7/30
USPC .............................................. 341/106, 67, 87
See application file for complete search history.

(56) References Cited

U.S. PATENT DOCUMENTS

| 5,818,368 | A  | * | 10/1998 | Langley | ........................ 341/106 |
| 8,593,307 | B2 | * | 11/2013 | Seo et al. | ........................ 341/65 |
| 8,593,312 | B2 | * | 11/2013 | Oh | ................................. 341/87 |
| 8,610,605 | B2 | * | 12/2013 | Froemmgen | .................... 341/59 |

* cited by examiner

*Primary Examiner* — Brian Young
(74) *Attorney, Agent, or Firm* — Conley Rose, P.C.

(57) ABSTRACT

A method of data compression includes obtaining a data set comprising a sequence of data blocks comprising a predetermined number of data items, partitioning said data set into one or more groups each comprising a predetermined number of data blocks, and performing data compression on one or more groups of data blocks. Data compression is performed by associating a control data item with each of said blocks, generating a control vector comprising the control data items assigned to each of said blocks within a group, removing data blocks comprising entirely data items having said specified value, compressing data blocks comprising at least one data item having a value different from said specified value using a fixed-rate compression scheme, providing a compressed data stream comprising said compressed data blocks, and providing an associated control vector stream to enable control of said compressed data stream.

26 Claims, 13 Drawing Sheets

SYSTEMS AND METHODS FOR DATA COMPRESSION AND PARALLEL, PIPELINED DECOMPRESSION

CROSS-REFERENCE TO RELATED APPLICATIONS

None.

BACKGROUND

Computer systems are often used to perform complex numerical calculations. One such application of this is in processing of recorded seismic data traces. Seismic datasets are often very large, containing many millions of acoustic wave recordings. Applications processing such datasets are very time consuming due to the large amount of data that must be processed and complex operations that must be performed.

SUMMARY

According to a first aspect of the present disclosure, there is provided a method of data compression, the method comprising: obtaining a data set comprising a sequence of data blocks, each data block comprising a predetermined number of data items; partitioning said data set into one or more groups each comprising a predetermined number of data blocks; and performing data compression on one or more groups of data blocks by: associating a control data item with each of said blocks, said control data item having a value dependent upon whether a block contains entirely data items having the same specified value or whether a block contains at least one data item having a value different from said specified value; generating a control vector comprising the control data items assigned to each of said blocks within a group; removing data blocks comprising entirely data items having said specified value; compressing data blocks comprising at least one data item having a value different from said specified value using a fixed-rate compression scheme; and providing a compressed data stream comprising said compressed data blocks; and providing an associated control vector stream to enable control of said compressed data stream.

Most implementations of run-length encoding are designed to transform a variable length input to a (ideally shorter) encoded variable length output. The present disclosure encodes a fixed-length input (superblock) to a variable length output, which allows for optimizations not possible in the general case. Assuming that the input is a fixed-length sequence of numbers with a high occurrence of zeroes means that the input can be encoded as a sparse vector as opposed to traditional run-length encoding. The decoder can be supplied with a vector controlling the decompression, and does not need to maintain large buffers to sustain high throughput.

In one embodiment, the method further comprises, prior to said step of associating, the step of: quantizing said data items to increase the number of data items having said specified value.

In one embodiment, the step of quantizing comprises applying a threshold to said data items within each of said blocks, wherein data items below said threshold are set to said specified value and data items at or above said threshold remain unchanged;

In one embodiment, said threshold is dynamically variable for different blocks and/or groups.

In one embodiment, prior to said step of associating, the method further comprises: applying a transform to data items in the data set.

In one embodiment, said transform comprises a wavelet transform.

In one embodiment, each group of blocks is compressed separately and has a unique vector associated therewith.

In one embodiment, the compressed data stream and control vector comprise separate data streams.

In one embodiment, the compressed data stream and control vector stream are combined.

In one embodiment, the number of data items in a group is large compared to the number of data items in a data block.

In one embodiment, said specified value is zero.

According to a second aspect of the present disclosure, there is provided an encoder for data compression, the encoder being operable to: obtain a data set comprising a sequence of data blocks, each data block comprising a predetermined number of data items; partition said data set into one or more groups each comprising a predetermined number of data blocks; and perform data compression on one or more groups of data blocks, the encoder being operable to perform data compression by: associating a control data item with each of said blocks, said control data item having a value dependent upon whether a block contains entirely data items having the same specified value or whether a block contains at least one data item having a value different from said specified value; generating a control vector comprising the control data items assigned to each of said blocks within a group; removing data blocks comprising entirely data items having said specified value; compressing data blocks comprising at least one data item having a value different from said specified value using a fixed-rate compression scheme; providing a compressed data stream comprising said compressed data blocks; and providing an associated control vector stream to enable control of said compressed data stream.

According to a third aspect of the present disclosure, there is provided a method of data decompression, the method comprising: obtaining a compressed data stream comprising one or more compressed data blocks, each block comprising a predetermined number of data items and said compressed data stream being obtained from an uncompressed data set; obtaining an associated control vector stream to enable control of said compressed data stream, said control vector stream comprising a sequence of control data items each corresponding to a block of said uncompressed data stream; reading at least one control data item of said control vector stream and, in dependence upon the value of control data item, for each control data item either: generating a data block comprising said predetermined number of data items, each of said data items having the same specified value; or decompressing the data block corresponding to said read data control item; and then: outputting said generated or decompressed data block as part of a decompressed data stream; and repeating the above step of reading for subsequent control data items.

In one embodiment, a single control data item is read and a single uncompressed block is output per clock cycle.

In one embodiment, N control data items are read and N uncompressed blocks are output per clock cycle.

In one embodiment, N is an integer.

In one embodiment, said step of decompressing comprises decompressing a plurality of data blocks in parallel.

In one embodiment, said step of decompressing further comprises moving one or more decompressed data blocks into a buffer for utilization in a subsequent clock cycle.

In one embodiment, the compressed data stream and the control vector stream are obtained separately.

In one embodiment, the compressed data stream and the control vector stream are obtained in a combined stream, and the method further comprises, prior to said step of reading, the step of: extracting the control vector stream from said combined stream.

In one embodiment, said step of extracting comprises extracting the number of control data items equal to the number of data items in a block.

In one embodiment, said specified value is zero.

According to a fourth aspect of the present disclosure, there is provided a decoder for data decompression, the decoder being operable to: obtain a compressed data stream comprising one or more compressed data blocks, each block comprising a predetermined number of data items and said compressed data stream being obtained from an uncompressed data set; obtain an associated control vector stream to enable control of said compressed data stream, said control vector stream comprising a sequence of control data items each corresponding to a block of said uncompressed data stream; read at least one control data item of said control vector stream and, in dependence upon the value of control data item, for each control data item either: generate a data block comprising said predetermined number of data items, each of said data items having the same specified value; or decompress the data block corresponding to said read data control item; and then: output said generated or decompressed data block as part of a decompressed data stream; and repeat the above step of reading for subsequent control data items.

According to a fifth aspect of the present disclosure, the second or fourth aspect is implemented on a Field Programmable Gate Array or an Application Specific Integrated Circuit.

According to a sixth aspect of the present disclosure, there is provided a non-transitory computer-readable medium having stored thereon a computer program executable by a programmable processing apparatus, comprising one or more software portions for performing the steps of the first aspect.

According to a sixth aspect of the present disclosure, there is provided a non-transitory computer-readable medium having stored thereon a computer program executable by a programmable processing apparatus, comprising one or more software portions for performing the steps of the third aspect.

BRIEF DESCRIPTION OF THE DRAWINGS

For a detailed description of exemplary embodiments, reference will now be made, by way of example only, to the accompanying drawings in which.

NOTATION AND NOMENCLATURE

Figure 2:
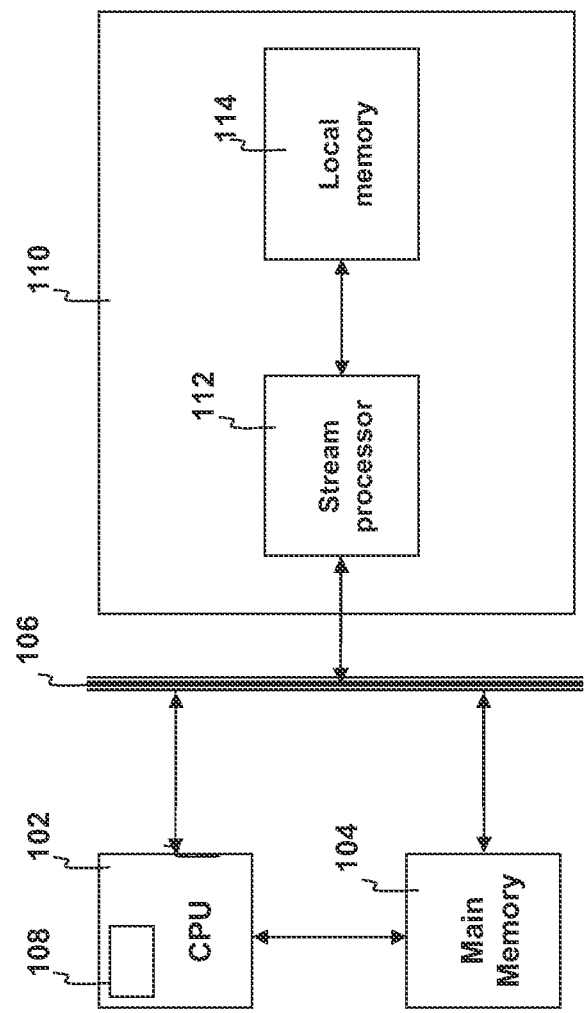
FIG. 2 is a schematic diagram of a computing device including an accelerator card.

In the following discussion and in the claims, the terms "including" and comprising" are used in an inclusive fashion, and thus should be interpreted to mean "including, but not limited to . . . ", Also, the term "couple" or "couples" is intended to mean either an indirect or direct connection. Thus, if a first device couples to a second device, that connection may be through a direct connection or through an indirect connection via other devices and connections.

DETAILED DESCRIPTION

The following discussion is directed to various embodiments of the disclosure. The embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

The present disclosure relates to a method of, and apparatus for, processing a computation on a computing device. More particularly, the present disclosure relates to a method of, and apparatus for, mitigating memory capacity and bandwidth limitations when performing numerical calculations One approach to increase the speed of a computer system for specialist computing applications is to use additional or specialist hardware accelerators. These hardware accelerators increase the computing power available and concomitantly reduce the time required to perform the calculations.

A suitable system for performing such calculations is a stream processing accelerator having a dedicated local memory. The accelerator may be, for example, located on an add-in card which is connected to the computer via a bus such as Peripheral Component Interconnect Express (PCI-E).

The bulk of the numerical calculations can then be handled by the specialized accelerator. Stream processor accelerators can be implemented using, for example, Field-Programmable Gate Arrays (FPGAs), Application Specific Integrated Circuits (ASICs) and/or structured ASICs. Stream processors implemented as FPGAs generally provide much more computational power than a CPU and so are able to perform calculations more quickly than a CPU. In certain cases, such arrangement may increase the performance of highly parallel applications by over an order of magnitude or more.

However, the volume of data required to be processed during a step of a calculation may be very large. Since it is desirable for seismic models to be as accurate as possible, the general trend is for the amount and precision of the data used to increase.

As a result, for data-intensive calculations, storage capacity and memory bandwidth may become the bottlenecks in a step of a calculation. This is particularly true for stream processors, where the upper limit on the speed of an algorithm may be imposed by the bandwidth limitations between the stream processor and the local memory, rather than the speed at which the stream processor can perform calculations. Furthermore, for many algorithms, if data can not be held in the local memory it must be accessed from disk which is often too slow to enable fast processing, thus availability of sufficient memory capacity is also critical.

One approach to alleviate the above issue is to compress the data. In general, compression refers to methods which reduce the physical size of the data set. A number of different compression schemes may be utilized. One scheme may be to reduce the precision of data values in a data set from double precision (which gives around 15 decimal places of precision) to single precision (which gives about 7 decimal digits of precision). Other compression schemes may include block coding or transform based methods such as wavelet or discrete cosine and predictive methods.

A key distinction between compression schemes is whether they operate at a fixed rate (i.e. N bits of input always transforms to M bits of output) or variable rate (i.e. the number of bits of output for each N bits of input varies depending on the input values). Fixed rate compression schemes often lend themselves to efficient implementations in hardware at high performance because they are easy to parallelize; however by treating all parts of the input data the same they often can not achieve high compression rates at acceptable quality levels. In contrast, variable rate schemes can exploit patterns in the input data or differences between the importance of different input data regions to obtain better compression rates for a given quality; however they can be hard to implement in a parallel manner.

A useful form of lossless, variable-rate data compression is run-length encoding. Run-length encoding (RLE) is a form of data compression in which runs of data (i.e. sequences in which the same data value occurs in a number of consecutive data elements) are stored as a single data value and count, rather than as the original run. RLE is an efficient method for variable rate compression.

Compressed data must be decompressed before it can be used in a numerical calculation. In certain methods, the highly parallel, pipelined, wide bus nature of an FPGA/ stream processor accelerator can be used to perform high speed decompression of data with little or no speed penalty. However, this is difficult to do with compressed RLE data. This is because, in RLE, there is a tightly dependent relationship between the current input symbol, the current output symbol and the next output symbol.

This tight feedback loop means that it is not possible to pipeline the control flow in a run length decoder and still operate at full processing rate, since an input value must be immediately turned around into a read/not-read of the next input value in a single clock cycle.

Figure 1:
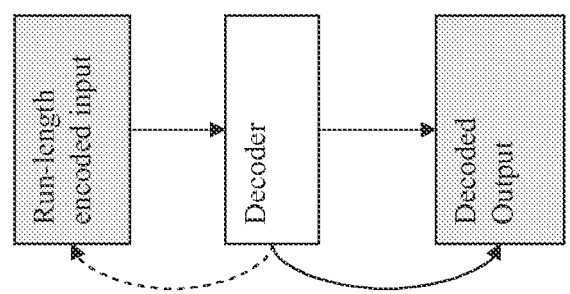
FIG. 1 is a schematic illustration of a run length decoder.

FIG. 1 illustrates the above problem schematically. A decoder is shown having a run-length encoded input and a decoded output. However, due to the interrelationship between the input and output, it is necessary to provide a control signal (shown by the dotted line) since the decision as to whether to read a new input is dependent upon the previous input. This sequence-dependence means that it is difficult to pipeline these operations in a hardware implementation.

Further, the variable input rates of variable rate decompression (and in particular run length decoding) make it hard to parallelize. By way of example, consider the case where a run length code is (VALUE, RUNLENGTH) and an input data stream is as set out in expression 1):
1) (A, 1) (B, 1) (C, 3) (D, 5) (E, 1)
The output stream will be:
2) A B C C C D D D D D E
If the decoder wished to produce two output points per cycle it may need to read zero, one or two input words per cycle. For example to decode this sequence:
3) Cycle 1: (A, 1) (B, 1)==>A B
  Cycle 2: (C, 3) XXX==>C C
  Cycle 3: (D, 5) XXX==>C D
  Cycle 4: XXX XXX==>D D This means that the decision whether to read an input value is dependent on the previous value. E.g. in cycle 4, no input is read because the previous value contained a run that will still be being generated this cycle. This makes pipelining of a digital circuit implementing this logic difficult, with a negative impact on achieved clock frequency.

As the number of parallel points to be generated in one cycle increases, a run length decoder becomes increasingly complicated to handle the alignment of input and output fields, and ultimately impractical. If the decoder is not able to provide output data at a sustained rate, a downstream processing pipeline may not be able to run at full performance.

An alternative method of parallelization is to "coarse-grain" parallelize by decompressing multiple independent data streams in parallel, even though each data stream may only be processed at one value per cycle or less. This approach is particularly suitable for e.g. multi-core CPUs which are designed to execute multiple coarse-grained parallel processes, however it is inefficient in a stream processor since data must be buffered, distributed to each coarse-grained processing unit, and then reassembled after decompression. For M independent data streams of size N, this requires 2×N×M elements of buffering, which quickly grows impractical as N and M increase.

General run length encoding allows runs of any value to be encoded (as in the example above). However in scientific data, the number of possible numerical values is very large and due to noise effects it is very unlikely that any two numbers will have exactly the same bit pattern, therefore runs will be rare. The only value that will commonly produce a run is 0, which represents not just values that are exactly zero but any that are so close to zero that the difference cannot be measured.

A common reason for wanting to compress a dataset is because an algorithm is memory bound, in terms of bandwidth or capacity. If data is streamed from memory in a compressed format and then decompressed when it is used, memory capacity is multiplied and we effectively gain more memory bandwidth.

For this approach to work, we require the decompression to be able to run at or close to the same speed as the memory can supply the data. For example, if the data is supplied at 50 GB/s into a decompression unit running at 200 MHz then we would need to decompress more than 256 bytes per cycle. Even if we assume a 4 byte symbol, then this means we need to decompress 64 symbols in parallel.

As explained above, it is impractical to decompress many symbols in parallel. So, for example, if we coarse-grain parallelize the decompression by having 8 memory streams and a 4 byte symbol, this means the decompression unit can output 32 bytes per cycle, which is less than 6 GB/s at 200 MHz. This means that decompression has effectively reduced our memory bandwidth, and thus reduced the speed of computation. Memory streams are expensive, an algorithm may not be amenable to having multiple independent streams, and 4 bytes is reasonably large for a compressed symbol. Therefore, in most cases we would expect our output bandwidth to be much lower than in this example.

Compressed data may be utilized in computations. For example, US 2010/0030932 relates to a method of obviating a bottleneck caused by the relatively slow transfer of data between a host computer and a peripheral processing device, by using data compression and decompression. The peripheral device is configured to decompress the data, process it, and compress the output before returning the output of a given algorithm.

Numerous compression approaches may be utilized. U.S. Pat. No. 5,933,790 discloses a method for data compression of seismic signal data. U.S. Pat. No. 4,371,951 discloses a method for converting a serial input sparse vector to a parallel structure. U.S. Pat. No. 5,745,392 discloses a data compression approach that minimizes the required storage space.

However, prior compression methods and associated hardware have suffered from the technical problem that such variable rate compression and decompression cannot be achieved at high speed in parallel, pipelined hardware.

FIG. 2 shows a schematic view of a computing device 100. The computing device 100 comprises a Central Processing Unit (CPU) 102, a main memory 104 and an interconnect 106.

The CPU 102 may take any suitable form and comprises a processor for carrying out the instructions of a computer program run on the computing device 100. The CPU 100 is the primary element carrying out the functions of the computing device 100. The CPU 102 is commonly located on a motherboard (not shown) which comprises the necessary contacts to supply the CPU 102 with power and to connect the CPU 102 to other components in the computing device 100.

The main memory 104 is associated with the CPU 102 and comprises an area of RAM. The RAM may take the form of SRAM, Dynamic RAM (DRAM) in which bits of data are stored as a charge in a capacitor or transistor gate, or any other suitable memory type. As is common for many computing applications, the main memory 104 may be provided as a plurality of SRAM or DRAM modules. These modules can quickly be replaced should they become damaged or when greater storage capacity is required. The main memory 104 is able to communicate with the CPU 102 via the motherboard forming part of the computing device 100.

The interconnect 106 enables additional devices to be connected to the computing device 100 and to communicate with components of the computing device 100. The interconnect 106 may take any suitable form, for example a Peripheral Component Interconnect Express (PCI-E) data bus. The interconnect 106 acts as a motherboard-level interconnect to link motherboard-mounted peripherals, as an expansion card interface for add-in cards or as a network interconnect to connect to other computing devices.

In this embodiment, the computing device 100 further comprises an accelerator card 110. The accelerator card 110 is configured to connect to the interconnect 106 and may be, for example, a PCI-E format expansion board comprising interconnects suitable for connecting to a PCI-E data bus.

Whilst, for clarity, only a single accelerator card 110 is included in the following example, it would be readily apparent to the skilled person that additional accelerator cards may be included to provide additional computational power. For example, four accelerator cards may be included in parallel or series within one system, with each card communicating to the CPU 102 and to each other.

The accelerator card 110 comprises a stream processor 112 and a local memory 114. The local memory 114 is configured for fast access by the stream processor 112 and may comprise simple flip-flops or more complete blocks of memory such as Embedded Block RAM memory.

In this embodiment, the stream processor 112 comprises an FPGA-based processor. Different types of FPGA processors may be used; however the larger and more arithmetic function-rich FPGAs are more desirable.

Figure 3:
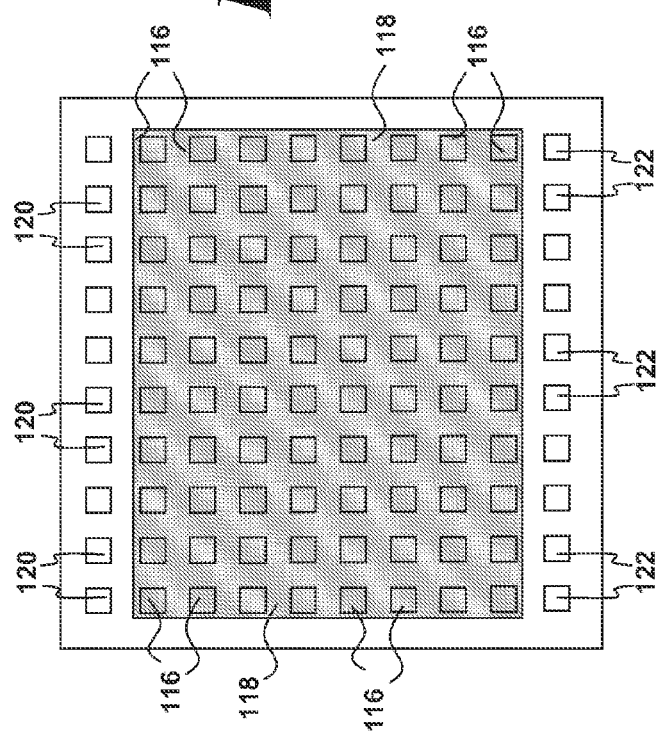
FIG. 3 is a schematic diagram of an FPGA stream processor forming part of the accelerator card of FIG. 2.

FIG. 3 shows a schematic diagram of a stream processor 112 in the form of an FPGA. The FPGA stream processor 112 is an integrated circuit which is configurable after manufacture. The FPGA stream processor 112 comprises a programmable semiconductor device which comprises a matrix of configurable logic blocks (CLBs) 116 connected via programmable reconfigurable interconnects 118 (shown here as the shaded area in FIG. 2). The configuration of the FPGA interconnects 118 are usually specified using a hardware description language (HDL). The HDL is generally similar to that used for an application-specific integrated circuit (ASIC). In order to get data into and out of the FPGA stream processor 112, a plurality of input pads 120 and output pads 122 are provided.

Figure 4:
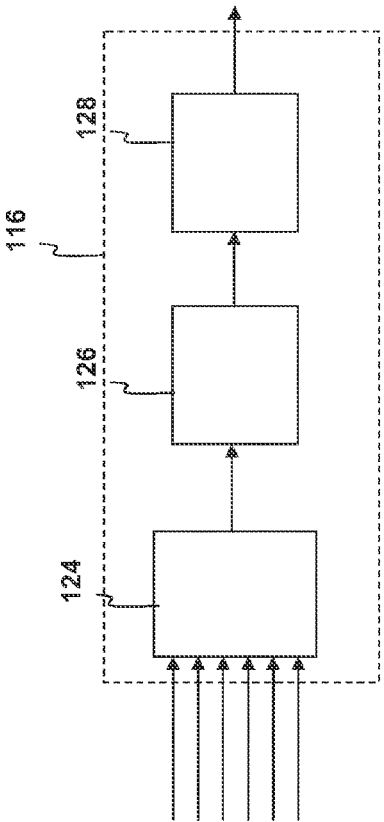
FIG. 4 is a schematic diagram showing a programmable logic block forming part of the FPGA stream processor of FIG. 3.

The CLBs 116 are the basic logic unit of the FPGA 112. A schematic diagram of a typical CLB 116 is shown in FIG. 4. The CLB 116 comprises a configurable switch matrix comprising typically a 4 or 6 input look up table (LUT) 124, some specialist circuitry (such as, for example, a multiplexer), one or more flip-flop units 126 which act as temporary memory storage and an output 128.

The switch matrix of each CLB 116 can be configured to perform a variety of functions; for example, logic gates such as NAND and XOR, or more complex functions. A typical FPGA may comprise up to $10^6$ LUTs. The CLBs 116 are able to operate in parallel, providing a powerful resource for numerically-intense calculations.

FPGA-based processors comprise calculation functions mapped into circuit units along the path from input to output. The FPGA then performs the computation by streaming the data items through the circuit units. The streaming architecture makes efficient utilization of the computation device, as every part of the circuit is performing an operation on one corresponding data item in the data stream at any point during the calculation.

Figure 5:
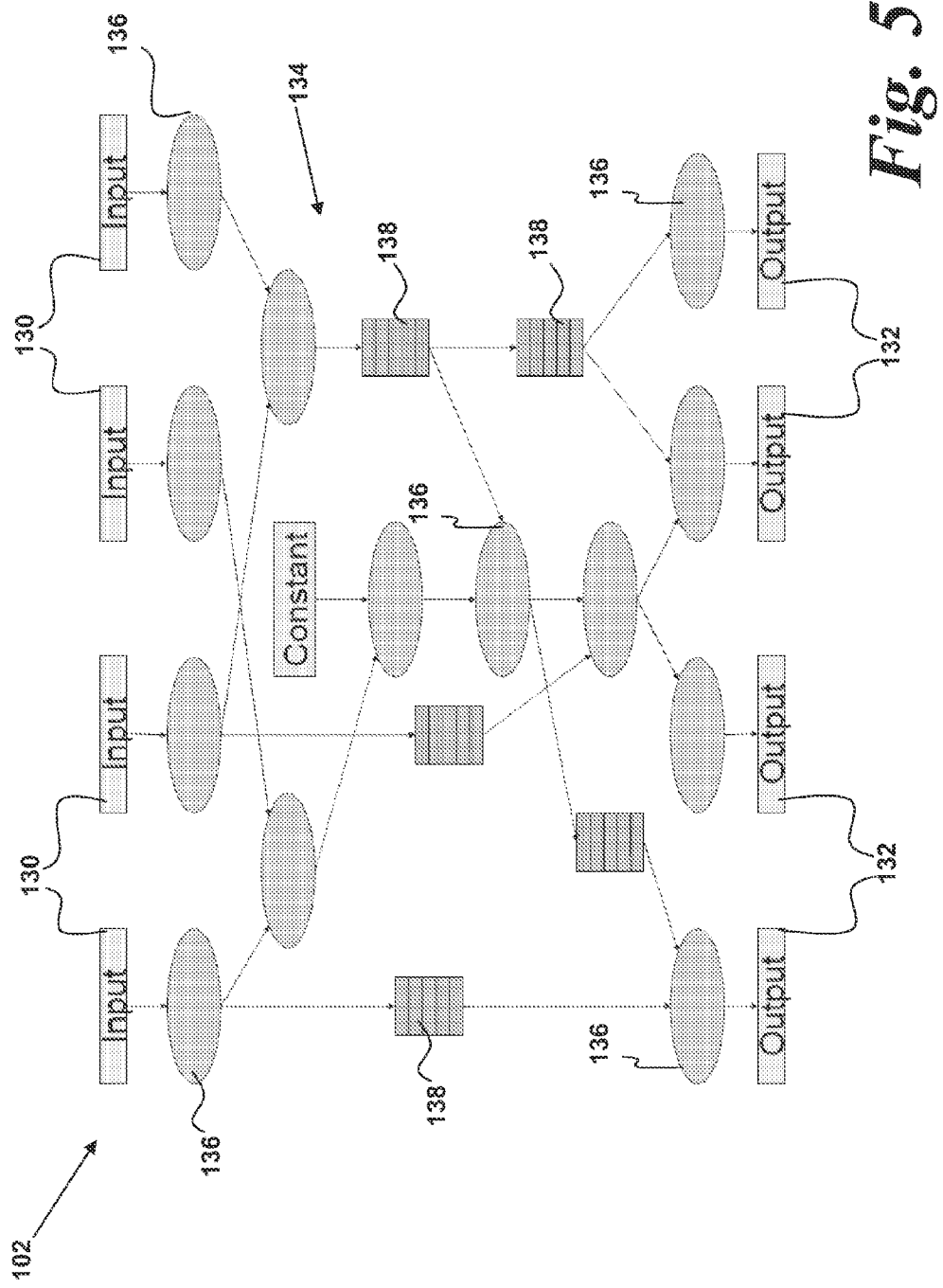
FIG. 5 is a schematic diagram of the computation structure of the FPGA stream processor of FIG. 1.

FIG. 5 shows an example of such a streaming architecture created using the CLBs 116 of the FPGA stream processor 112. FIG. 5 shows a 4 input 130-$i$, 4 output 132 stream computing engine implemented on the stream processor 112.

Between the inputs 130 and the outputs 132 is provided a computational data path 134. The computational data path 134 is implemented in the CLBs 116 and comprise arithmetic operations 136 (performed in one or more LUTs 124) and buffer memories 138. As shown, the computational data path 134 is arranged to process data in parallel.

In operation, the data is streamed through the CLBs 116 of the FPGA stream processor 112 and the arithmetic operations 136 are carried out on the data as it is streamed. This is in contrast to conventional processors in which instructions are generally processed sequentially, although some limited parallelism may possible on some processors. Data is saved to cache during this process and movement of data is directed by the program operating on the CPU.

Figure 6:
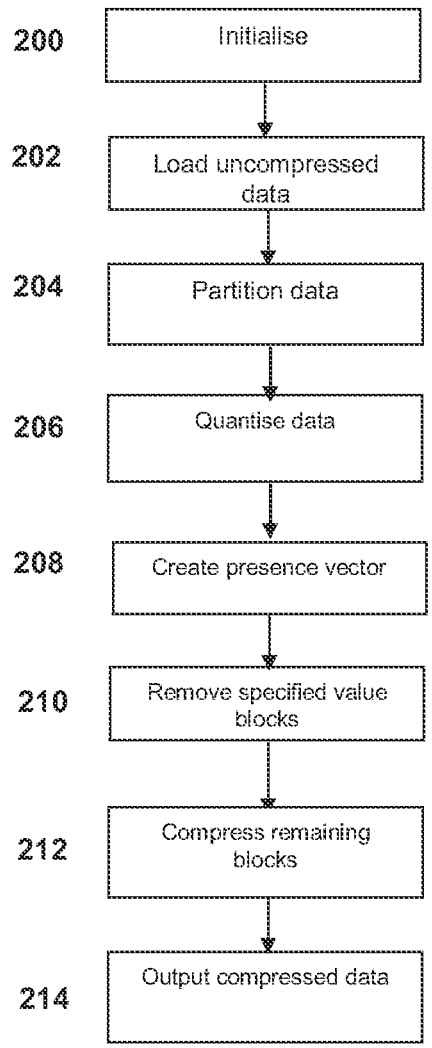
FIG. 6 is a flow chart of a method of encoding according to an embodiment.

The present disclosure will now be described with reference to the computing device 100 comprising an FPGA-type stream processor 112 accelerator as described above. A method of compression according to a first embodiment of the present disclosure will now be described with reference to FIG. 6.

In many cases, compression is carried out on a particular data set only once. In contrast, decompression may be carried out several times or on demand. Therefore, compression can be a more computationally expensive operation than decompression as a direct result of the reduced number of times in which it needs to be carried out.

In this embodiment, the compression is carried out by the CPU 102 streaming uncompressed data from the main memory 104. However, other arrangements may be used as required. This is not material to the present disclosure. Compression may be carried out on dedicated hardware or any other suitable hardware.

Step 200: Initialize

At step 200, the computation is initialized. At this point, the CPU 102 runs the program which initializes the numerical computation. The method then proceeds to step 202.

Step 202: Load Uncompressed Data

At this point, the CPU 102 retrieves the uncompressed data set required for solving the necessary computation. In one example, this will be in the form of a multiplicity of sets of seismic trace data.

Seismic traces comprise time-domain measurements of real-world parameters measured by detectors located at specific physical locations. Commonly, a large number of detectors are laid out in long lines (in the case of 2D data acquisition) or in sets of lines or in a grid (for 3D acquisition). The detectors are connected to trace acquisition apparatus such as a computer or other electronic storage device. Detectors such as geophones are used to record acoustic waves and, additionally or alternatively, other detectors may be used to measure particle velocities. A source generates a pressure variation (e.g. an explosion) and the detectors are used to measure the variation of the physical parameter under consideration.

Therefore, a complete set of measured seismic data generally comprises many hundreds of individual time-domain traces, each measured by specific detector at a specific physical location. Consequently, much of the data will be zero or close to zero, with occasional oscillations in the measured parameter due to reflected shock waves etc. In addition, the seismic traces are generally all in approximately the same format, i.e. the same number of data points and similar scaling for each trace forming part of the data set.

The size of the data set may be very large and, if used uncompressed, may lead to storage and/or bandwidth limited processing speed. The data is thus compressed in subsequent steps. The method then proceeds to step 204.

Step 204: Partition Data into Superblocks

The CPU 102 first partitions the data into a plurality of groups or "superblocks". A superblock may take any suitable size and, preferably, comprises a plurality of blocks which are small relative to the superblock size. For example, in one embodiment, a superblock comprises 2048 items and a block comprises 8 items. Thus, in one embodiment, a superblock comprises 256 blocks.

Many data sets contain natural boundaries which can be used to define the superblocks. In one example, a superblock contains all the data from a single seismic trace measurement. A seismic data set generally comprises many terabytes of data. However, the data set is made up of millions of detector traces, where each trace is typically 1000-4000 items in length, and each item is stored as a 32-bit value.

The choice of superblock boundary is significant since random access into the compressed data is possible at the superblock level. Therefore, it is desirable that the superblock size and configuration is selected such that associated data items are located within the same superblock. Each superblock is compressed separately as will be described below. Once the superblocks are defined, the method then proceeds to step 206.

Step 206: Quantize Data

Once the data is organized into groups or superblocks of a pre-defined size, the data within the blocks is then quantized to increase the number of data items having a specified value. In this, and subsequent, embodiments, the specified value is zero. However, the skilled person would be readily aware that the specified value may take any desired value. For example, if a data set has a particular baseline level different from zero, then the specified value could be set to that level to improve the compression level.

In one embodiment, the quantization is achieved using a thresholding function. A threshold magnitude is defined. Data blocks having values below the threshold magnitude are set to zero. Blocks having values above the threshold magnitude are left unchanged.

The threshold magnitude may be adjusted dynamically during encoding to achieve a desired trade-off between compression rate and data accuracy.

At the end of step 206, each block in the superblock can be divided into one of two categories. Either a block comprises entirely zero-value items, or a block contains one or more non-zero data items. By way of example, consider the following sequence of data items: 0.0-0.1 0.2-0.3 0.4-0.5 0.6-0.7 0.8-0.9 1.0-1.1 1.2-1.3 1.4-1.5.

The block size is defined as 4 data items, and a threshold value of 0.5 is applied. Therefore, four blocks are defined by the above data items: Blocks 0 to 4.

Block 0 comprises data items (0.0-0.1 0.2-0.3), all of which fall below the threshold and so this block is set to zero. Block 1 comprises data items (0.4-0.5 0.6-0.7) and so some of these items exceed the threshold. Therefore, this block is maintained unchanged. Finally, blocks 2 and 3 both contain data items above the threshold value and so remain unchanged. The method then proceeds to step 208.

Step 208: Create Presence Vector

Once the quantization has been performed in step 206, in step 208 the presence vector for the superblock is created. In other words, a vector is generated to encode whether each block is entirely zero, or contains at least one non-zero value. A value of 0 is assigned for entirely zero blocks, and a value of 1 otherwise.

A small vector of (superblock size/block size) bits is then generated, e.g. the vector will comprise 256 bits for a 2048-item superblock with 8-item block-size. A presence vector is provided for each superblock to enable control of the decompression of each superblock.

To use the example illustrated above in step 206, for the four blocks illustrated, the presence vector would be (0 1 1 1), indicating that block 0 contained only zeros after thresholding. The method then proceeds to step 210.

Step 210: Remove Specified Value Blocks

In steps 210 and 212, the data is compressed. In step 210, data blocks having entirely zero-value data items are removed from the data stream. The method then proceeds to step 212.

Step 212: Compress Remaining Blocks

In step 212, remaining blocks (i.e. blocks containing at least one non-zero data item) are then compressed using a fixed-rate data compression method. For example, such a method could involve reducing the number of bits to represent each number from 32 to 16, or multiplying the block by a common scale factor and representing each element within the block as a small integer. Typical fixed rate compression schemes suitable for seismic data have compression ratios in the region of 2×.

Step 214: Output Compressed Data

The compressed data for a superblock now comprises two elements—a presence vector having a number of bits equal to the number of blocks in a superblock, and a compressed stream of values. For typical seismic data traces, overall compression ratios of 3-5× are easily achievable. Once the data has been compressed, it may then be transmitted from the CPU 102 and memory 104 to the stream processor 112 in compressed format.

This compression process has numerous advantages for enabling fast and efficient decompression. Dependencies are greatly simplified by separating the presence vector from the compressed data value stream, meaning that the presence vector $V_p$ can be read quickly into a decoder at the start of a decompression process and used to control when input data is read/output data is written, with no dependencies between values in the data value stream. This will be described later.

Figure 7:
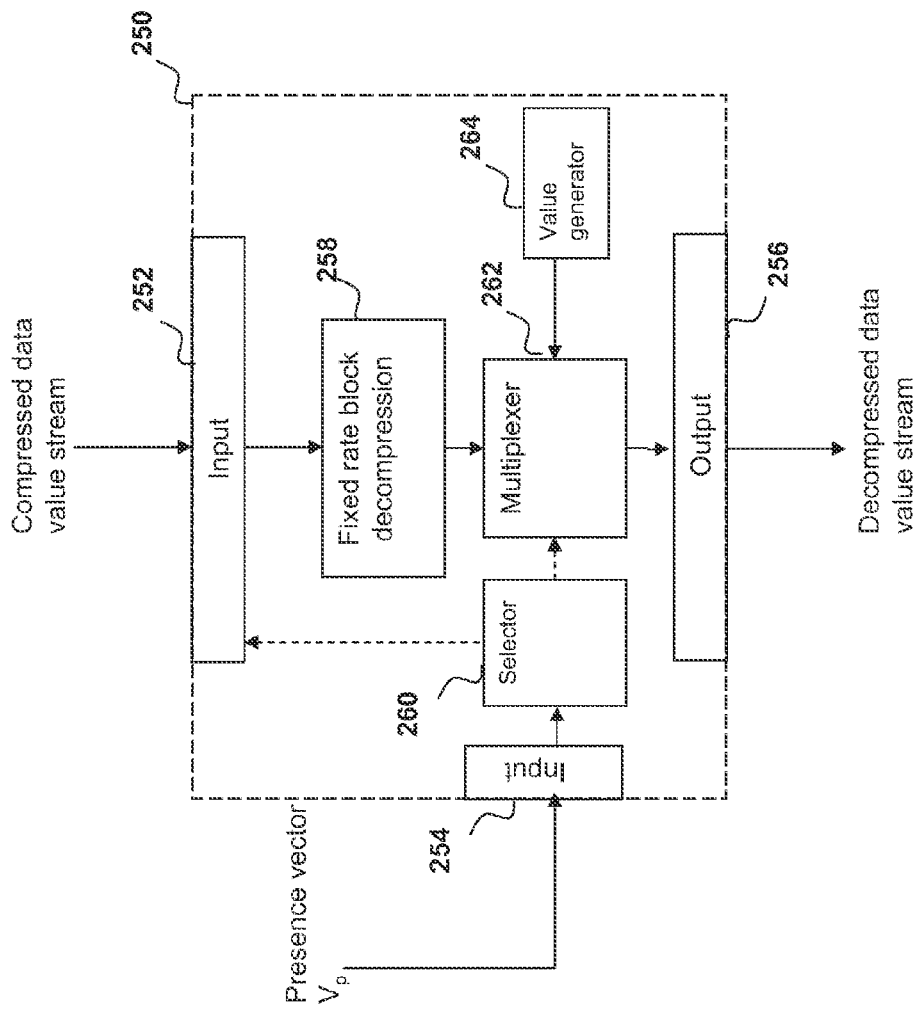
FIG. 7 is a schematic diagram of the components of an embodiment of a decoder.

The stream processor 112 comprises a decoder. A first embodiment of a decoder 250 is shown in FIG. 7. In FIG. 7, the components of the decoder 250 are shown as functional blocks. This embodiment of decoder 250 is operable to process a single block per clock cycle.

The decoder 250 comprises a data input 252, a presence vector input 254 and an output 256. A stream of compressed values is received at the input 252, and the presence vector P is received at input 254 of the decoder 250. Both inputs 252, 254 may comprise memory buffers as required. The decompressed output data is provided at the output 256.

The decoder 250 further comprises a fixed rate decompression block 258, a multiplexer 260, a selector 262 and a specified value generator 264. The selector 262 is operable to determine whether input compressed data should be read at the input 252 in each cycle. Because there is no feedback dependency between the data input 252 and the selector, the operation of the selector and the input 252 can be pipelined. The compressed data is passed to the fixed rate block decompression block 258 which operates under the control of the selector 262. The selector 262 indicates whether a data block is to be read from the decompression block 258, or whether a specified value (which, in this embodiment, is zero) is to be supplied to the multiplexer.

The multiplexer is operable to combine the correct data in the correct order and output this to the output 256. The uncompressed data is then output to the remainder of the stream processor 112.

The stream processor 112 is then operable to perform the required calculation by streaming the uncompressed data through the computational data path 134 of the stream processor 112 using the decompressed data resulting from the decompression of the compressed data by the decoder 250. Once the data has passed through the computational data path 134, an intermediate result is obtained. If more steps of the iteration are required, then the stream processor 112 is further operable to perform a further step of the iteration.

Figure 8:
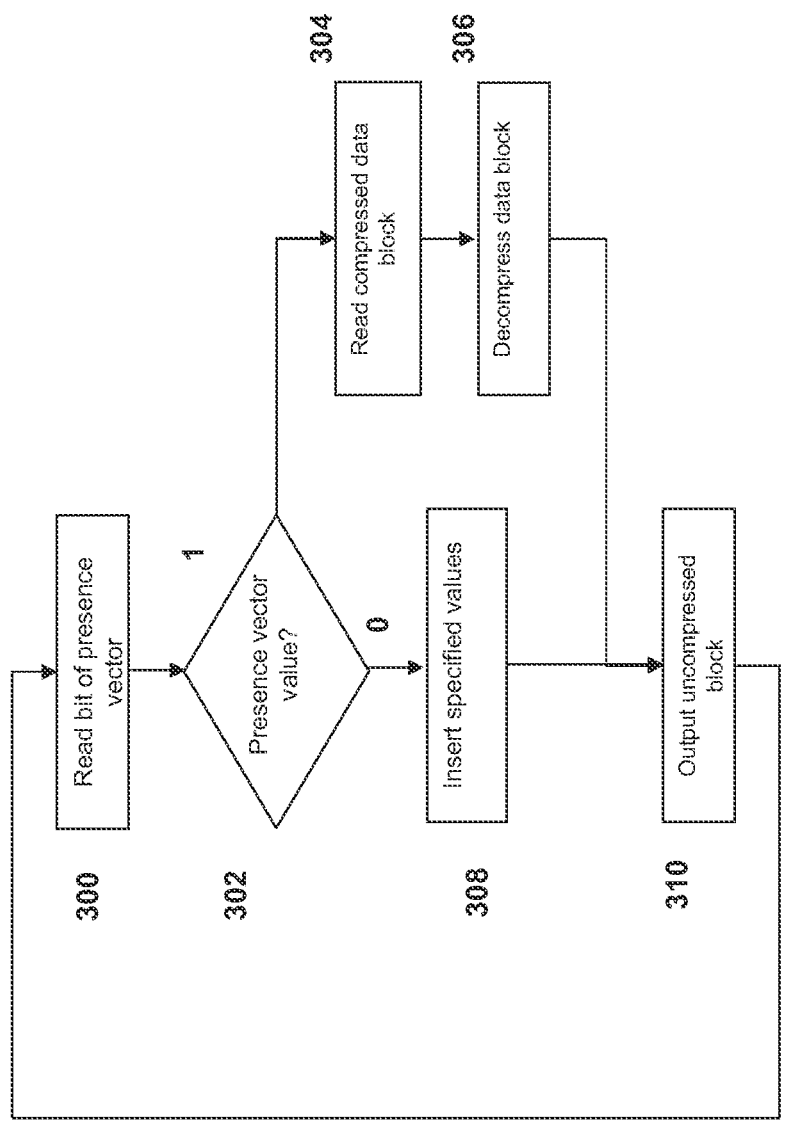
FIG. 8 is a flow chart of a method of decoding using the decoder of FIG. 7.

A method for performing a decoding operation will now be described with reference to FIG. 8. FIG. 8 shows a flow chart of a method of the decoding process.

Step 300: Read Bit of Presence Vector

In the above-described compression method, two components to the compressed data are generated—a presence vector $V_p$ unique to each superblock, and a compressed data stream for each superblock. These items are, in this embodiment, sent separately and received separately by the decoder 250. In step 300, the presence vector $V_p$ is read by the decoder 250 at input 254. The method then proceeds to step 302.

Step 302: Presence Vector 0 or 1 ?

At step 302, action is taken in dependence upon the value of the bit read for the presence vector $V_p$. The bits of the presence vector $V_p$ correspond directly to specific blocks of the compressed data stream and either indicate blocks containing entirely zeroes (bit 0) or blocks containing data (bit 1). For bit 1, the method proceeds to step 304. For bit 0, the method proceeds to step 308.

As set out above in relation to the encoding embodiment, the specified value in this embodiment is zero. However, other values of the specified value could be used. In this case, a bit value of zero in the presence vector indicates a block comprising data items having a value equal to the specified value.

Step 304: Read Data Block from Input Buffer

At step 304, the presence vector $V_p$ has a bit value of 1, indicating that the block corresponding to that bit of the vector comprises non-zero values. Therefore, a block of compressed data is read from the input buffer 252 into the fixed rate decompression block 258. The method then proceeds to step 306.

Step 306: Decompress Data Block

In step 306, the data block read in step 304 is decompressed using a fixed-rate decompression scheme. Once decompressed, the data is passed to the multiplexer 260 prior to being output in step 310.

Step 308: Insert Specified Values

If, in step 304, it is determined that the value of the presence vector bit for a given block is zero, then in step 308 a block of zeroes is generated by the specified value generator block 264. In other words, a run of items equal in number to the number of items in a given block are generated, each item having a value of zero.

As set out above, if the specified value is non-zero, then values equal to the specified value are generated here in place of the zero values described. The method proceeds to step 310.

Step 310: Output Uncompressed Block

In step 310, the uncompressed block generated in either steps 304 and 306, or in step 308 (for a zero value) is passed to the multiplexer and output by the output buffer 256. In this embodiment, a single block is output per cycle. The method then proceeds back to step 302 for the next clock cycle.

Figure 9:
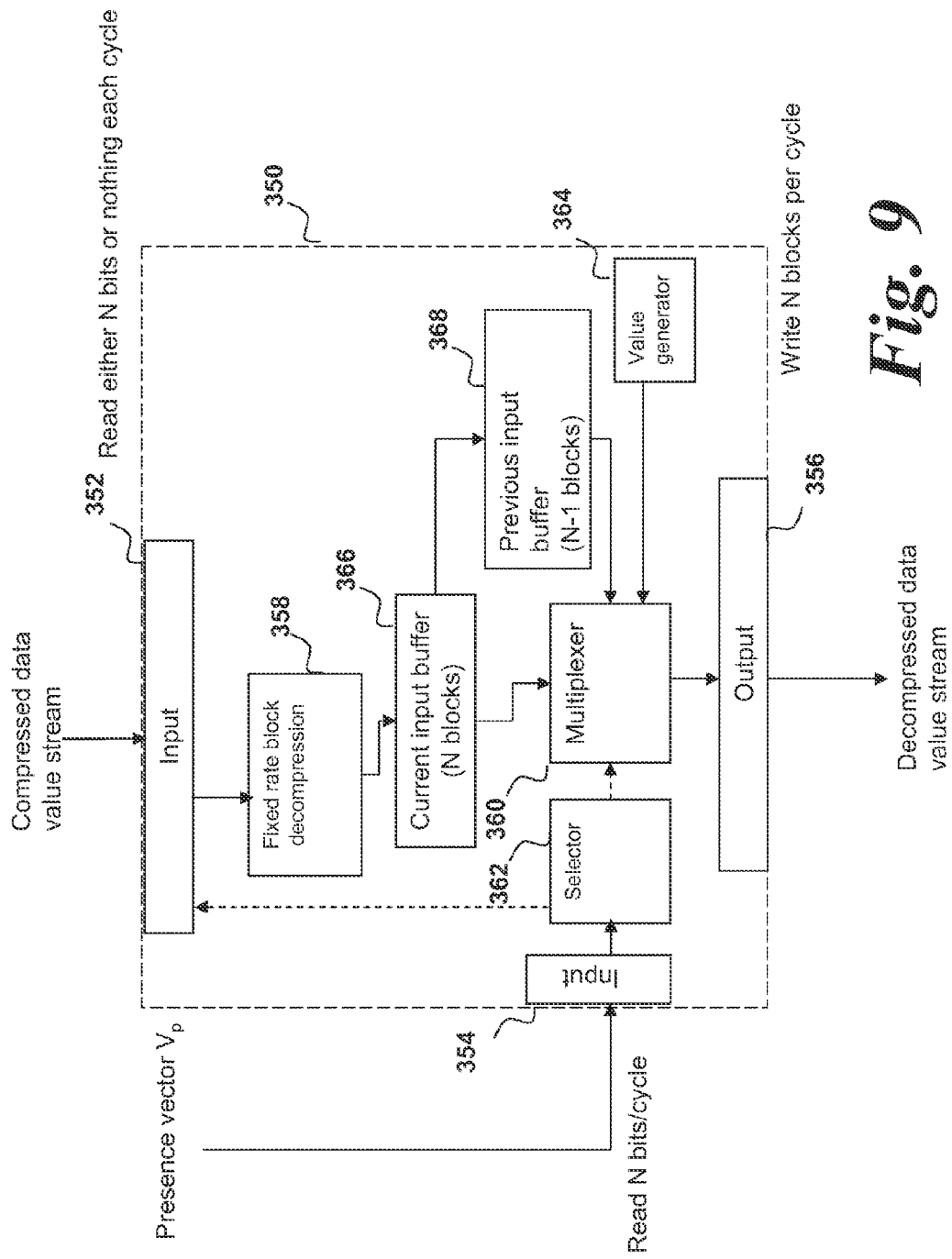
FIG. 9 is a schematic diagram of the components of an alternative embodiment of a decoder with further parallelization.

An alternative embodiment of a decoder 350 is shown in FIG. 9. In FIG. 9, the components of the decoder 350 are shown as functional blocks. This embodiment of decoder 350 is operable to process multiple blocks per clock cycle. This embodiment enables multiple blocks to be output per cycle, with support for reading multiple blocks per cycle. This is much simpler than in a general run length decoder case because (a) the presence vector is known in advance and thus the architecture can be pipelined without a tight latency constraint and (b) since blocks are fixed size, there is a limited mapping from positions in the input data stream to the output data stream.

The decoder 350 comprises a data input buffer 352, a presence vector input buffer 354 and an output buffer 356. A stream of compressed values is received at the input 352, and the presence vector $V_p$ is received at input 354 of the decoder 350. The decompressed output data is provided at the output 356.

The decoder 350 further comprises a fixed rate decompression block 358, a multiplexer 360, a selector 362 and a specified value generator 364 in common with the decoder 250 of the previous embodiment. However, in order to handle multiple blocks per clock cycle, a current input buffer 366 and a previous input buffer 368 are provided between the fixed rate decompression block 358 and the multiplexer 360. In addition, the fixed rate decompression block 358 comprises N instances of the fixed rate decompressor such that, if required, N blocks can be simultaneously decompressed.

As for the previous embodiment, the compressed data is passed to the fixed rate block decompression block 358. The selector 362 indicates whether a data block is to be read from the decompression block 358, or whether a zero is to be supplied to the multiplexer. This is based on reading the values of the bits of the presence vector Vp. In this embodiment, the presence vector Vp is read for N blocks, and then the selector 362 is utilized to select between either a current input, an input from the previous cycle or zero. The total buffering required is that required to store 2N−1 blocks, compared to 2N superblocks if coarse grained parallelization is utilized.

The decoder 350 decompresses input blocks first and then multiplexes between them. This offers a guarantee to the internal fixed rate decompressor 358 that blocks are non-zero, which may allow for a more optimized implementation.

Alternatively, compressed data may be sent to the multiplexer 360 and the fixed rate decompression block 358 being applied afterwards. This reduces the amount of data going through the buffers and multiplexers and may save resources in a hardware implementation. In both cases, there is a need for N instances of the fixed rate decompression block 358.

The multiplexer is operable to combine the correct data in the correct order and output this to the output 356. The uncompressed data is then output to the remainder of the stream processor 112 as for the previous embodiment.

Figure 10:
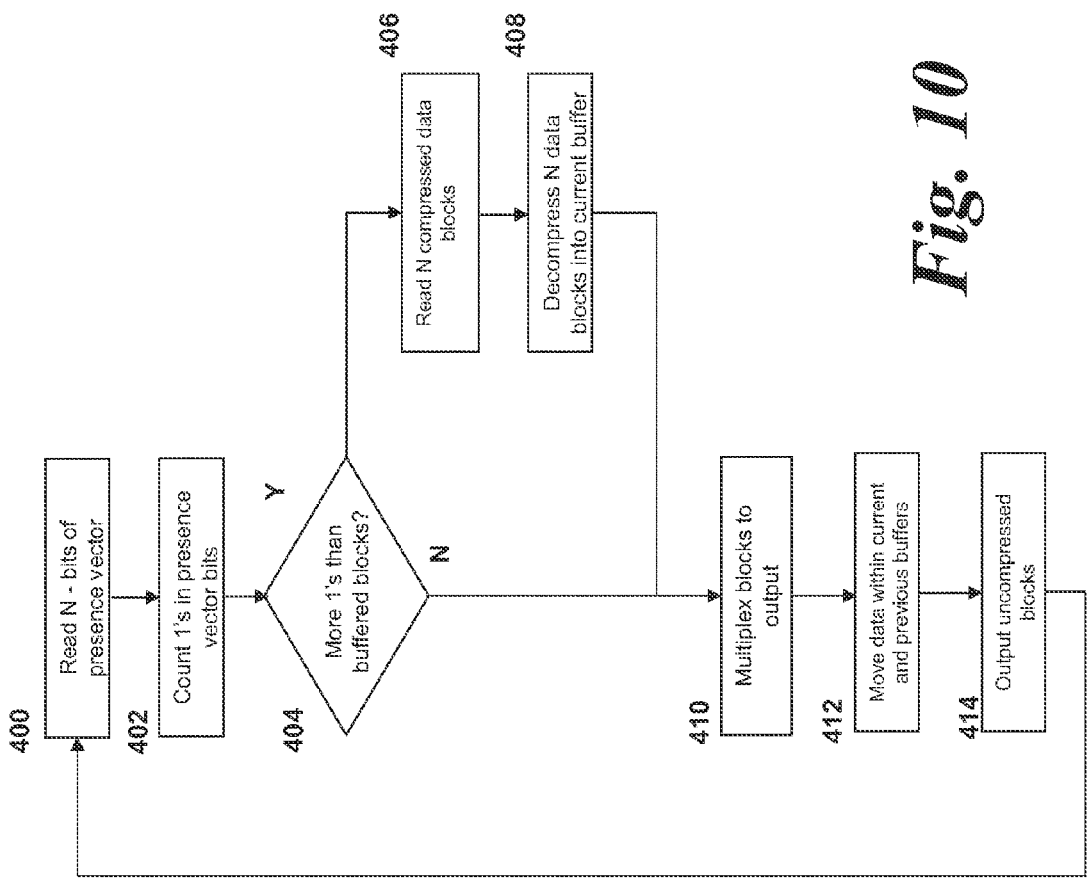
FIG. 10 is a flow chart of a method of decoding using the decoder of FIG. 9.

A method for performing a decoding operation will now be described with reference to FIG. 10. FIG. 10 shows a flow chart of a method of the decoding process utilizing the decoder of FIG. 9.

Step 400: Read N-Bits of Presence Vector

In the above-described compression method, two components to the compressed data are generated—a presence vector $V_p$ unique to each superblock, and a compressed data stream for the superblock. These items are, in this embodiment, sent separately and received separately by the decoder 350.

In step 400, N-bits (corresponding to N blocks) of the presence vector $V_p$ are read by the decoder 350 into the input buffer 354. The method then proceeds to step 402.

Step 402: Count 1's in N Presence Vector Bits

At step 402, the number of presence vector bits having a value of 1 (i.e. corresponding to data blocks containing non-zero data items) in the N bits read in step 400 is counted.

As set out above, if the specified value is non-zero, then the presence vector bits having a value of 1 correspond to data blocks containing at least one data item different from said specified value. The method then proceeds to step 404.

Step 404: More 1's in Presence Vector than Buffered Blocks?

At step 404, action is taken in dependence upon the number of bits of the presence vector having a data value of 1 out of the N bits read for the presence vector $V_p$. This number was determined in the previous step.

The N bits of the presence vector $V_p$ correspond directly to specific N blocks of the compressed data stream and either indicate blocks containing entirely zeroes (bit value 0) or blocks containing data (bit value 1).

In step 404, the number of bits of the presence vector having a value of 1 is compared to the number of blocks of data stored in the input buffers 366, 368.

If the number of 1's read from the presence vector is greater than the number of blocks stored in the input buffers 366, 368, then the method proceeds to step 406. If the number of 1's read from the presence vector is less than or equal to the number of blocks stored in the input buffers 366, 368, then the method proceeds to step 410.

Step 406: Read N Data Blocks from Input Buffer

At step 404, the presence vector $V_p$ has more bit values of 1 than there are blocks currently stored in the input buffers 366, 368. Therefore, N blocks of compressed data are read from the input buffer 352 into the fixed rate decompression block 358. The method then proceeds to step 408.

Step 408: Decompress N Data Blocks into Current Buffer

In step 408, the N data blocks read in step 406 are decompressed in parallel using a fixed-rate decompression scheme. The decompressed blocks are held in the current input buffer 366 prior to being multiplexed into the output stream. The method proceeds to step 410.

Step 410: Multiplex Data

The presence vector $V_p$ for the N blocks is then used to multiplex the N blocks to be output. The value of the bits of the presence vector $V_p$ is then used to determine whether the selector selects decompressed data from the current input buffer 366, the previous input buffer 368 or generates one or more blocks of zeroes by the specified value generator block 364. In other words, a run of items equal in number to the number of items in a given block are generated, each item having a value of zero.

As set out above, if the specified value is non-zero, then values equal to the specified value are generated in place of the zero values described. The method proceeds to step 412.

Step 412: Move Data within Current and Previous Buffers

In step 412, any data currently in the current input buffer 366 but not to be output in the current cycle is passed to the previous input buffer 368. Since the N blocks of compressed data will only be read into the input buffer 352 in the steps above if it is indicated by the presence vector that such data needs to be read, and at least one block will be output, then the data passed to the previous input buffer 368 will comprise no more than N−1 blocks. The method proceeds to step 414.

Step 414: Output Uncompressed N Blocks

In step 414, the uncompressed N blocks are output by the output buffer 356. The method then proceeds back to step 400 for the next clock cycle.

Figure 11:
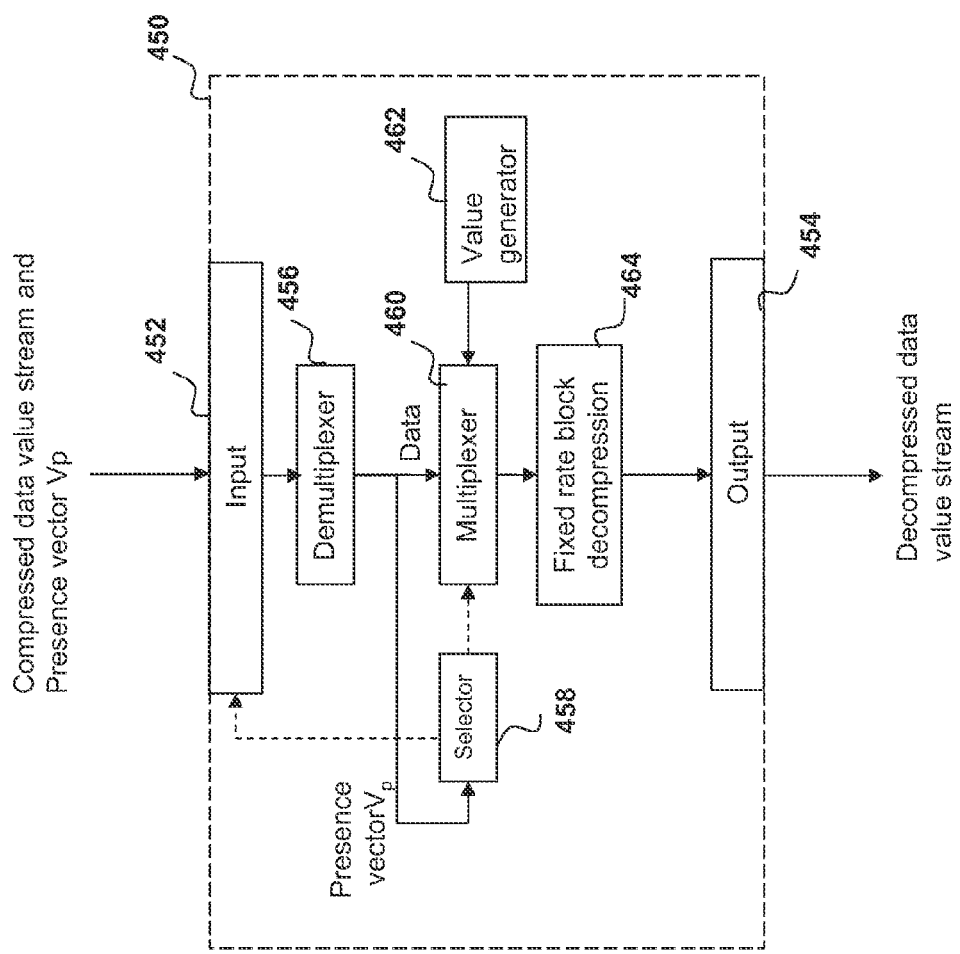
FIG. 11 is a schematic diagram of the components of a further embodiment of a decoder.

A further alternative embodiment of a decoder 450 is shown in FIG. 11. In FIG. 11, the components of the decoder 450 are shown as functional blocks. This embodiment of decoder 450 is operable to handle the inclusion of the presence vector as part of the data stream. In other words, in this embodiment, the presence vector is not provided separately. This may have some benefit in situations where it is undesirable to provide a separate input stream for the presence vector. For example, one large contiguous block can be read from the memory 104, and an extra buffer to hold the presence vector is not required. In general, reading contiguous data from DRAM is more efficient, and since data is read in bursts which may be hundreds or thousands of bits wide, packing everything together will, on average, mean reading fewer bursts from DRAM.

However, this embodiment has the disadvantage that the input stream and control of the input stream are inter-related, which increases the complexity of the dependencies. Which embodiment is used in practice will depend upon the situation in which the decoder is to be used and the particular advantages and disadvantages of each arrangement selected as appropriate.

The operation of this embodiment of the disclosure is as follows. The incoming data from the compression stream comprises both the compressed data blocks and the presence vector. The data stream comprises a header section including the presence vector $V_p$. The header section is the same size (in bits) as a compressed block of data values.

Therefore, at each cycle, the decoder 450 will read either nothing, or a data block of fixed size. Since the size of the header section containing the presence vector is known in advance, it is also known when to expect the next section. Therefore, a section of the presence vector has been read, the control for the next M blocks (where M is the bit-width of a block) is known. Therefore on each cycle we either output nothing (if we are reading a presence vector section), output data (if the presence vector bit is 1) or output zeros (if the presence vector bit is 0).

The decoder 450 comprises a data input buffer 452 and an output buffer 454. A data stream comprising a stream of compressed values interleaved with presence vector information is received at the input 452. The decompressed output data is provided at the output 454.

The decoder 450 further comprises a demultiplexer 456 arranged to separate the presence vector $V_p$ from the data stream. The presence vector $V_p$ is then sent to a selector 458 in communication with a multiplexer 460 and a specified value generator 462. The selector 456 is operable to store the section of the presence vector and on subsequent cycles utilize it to determine whether a block is to be read from the compressed data stream or whether a zero value is to be generated and input to the multiplexer 460. Downstream of the multiplexer 460 is located a fixed rate decompression block 464.

The multiplexer 460 is operable to combine the correct data in the correct order and output this to the output 454 via the fixed rate decompression block 464. The uncompressed data is then output to the remainder of the stream processor 112 as for the previous embodiment.

Whilst the presence vector and compressed data blocks are part of the same data stream they are not still logically separated, allowing the benefits of the scheme to be maintained.

Figure 12:
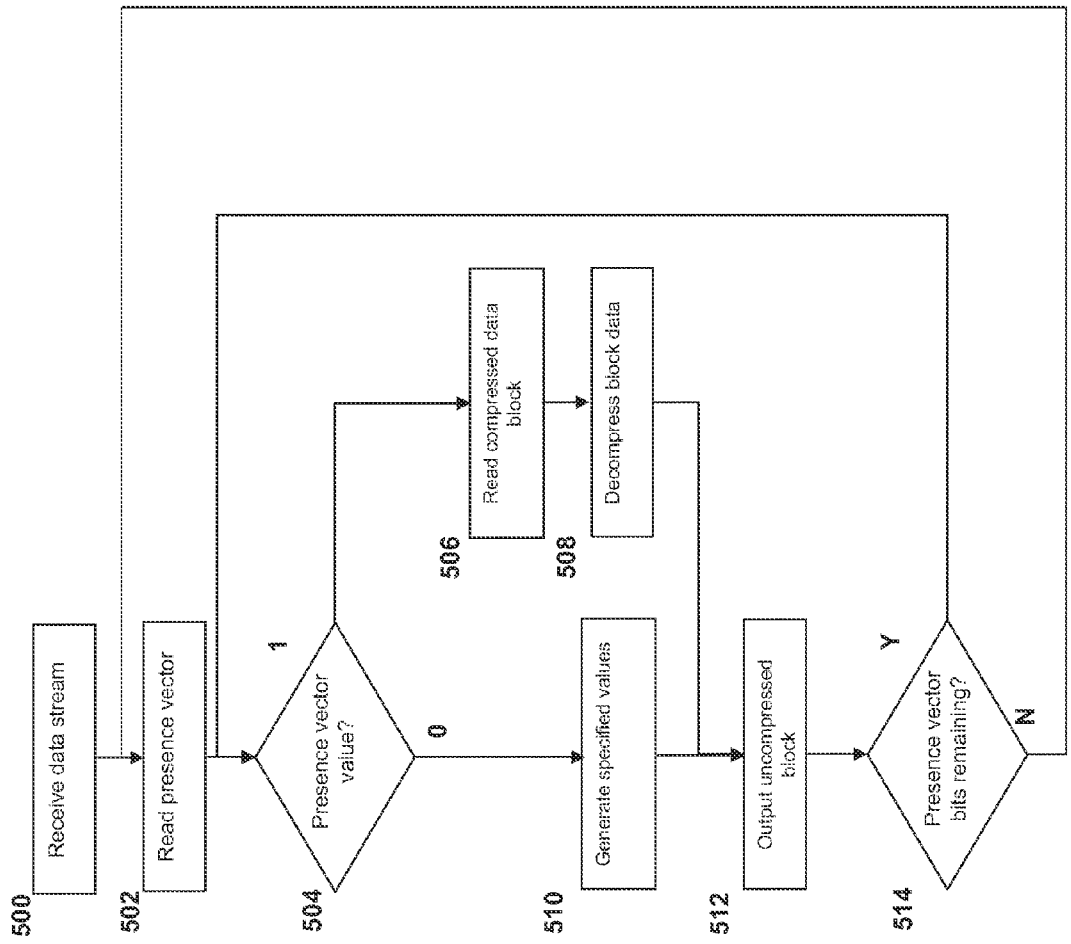
FIG. 12 is a flow chart of a method of decoding using the decoder of FIG. 7.

A method for performing a decoding operation will now be described with reference to FIG. 12. FIG. 12 shows a flow chart of a method of the decoding process.

Step 500: Receive Data Stream

In the above-described compression method, two components to the compressed data are generated—a presence vector $V_p$ unique to each superblock, and a compressed data stream. These items are, in this embodiment, combined into a single data stream and sent to the decoder 450.

Consider the following example, where the bit-width of the compressed data (Block size) is 4 bits:

Input data (in blocks): A 0 B 0 0 0 C D E 0 F G 0 H 0 0
Presence vector: 1010001110110100
Compressed data: (1010) A B (0011) C D (1011) E F G (0100) H In other words, the presence vector $V_p$ for M blocks (where M=4 in this example) is sent at the start of the compressed data sent for each superblock. This is received by the input buffer 452. Therefore, the presence vector values are packaged in headers of the same size as a block. The method then proceeds to step 502.

Step 502: Read Presence Vector

In step 502, the presence vector $V_p$ is separated from the compressed data in the incoming data stream by the demultiplexer 456 and is sent to the selector 458. At this point, the control for the next M blocks (where M is the bit-width of a block) is now known.

Therefore, based on the presence vector, it is known how many blocks of compressed data will follow the presence vector "block" because the number of bits of the M-bit presence vector having a value of 1 indicates the number of blocks of compressed data to be read in before the next control block of presence vector values. Therefore, it is known how many data blocks should be passed through to the multiplexer, and when the next presence vector "block" can be expected. The method proceeds to step 504.

Step 504: Presence Vector Value?

At step 504, the selector 458 is controlled in dependence upon the presence vector read in the previous step. Action is taken in dependence upon the value of the bits read for the presence vector $V_p$. The M bits of the presence vector $V_p$ correspond directly to specific M bits of the following data blocks of the compressed data stream and either indicate a block containing entirely zeroes (bit 0) or a block containing data (bit 1).

If a bit has a value of 1, the method proceeds to step 506. However, if the respective bit of the presence vector has a bit value 0, then the method proceeds to step 510.

Step 506: Read Compressed Data Block from Input Buffer

At step 506, the corresponding compressed data item from the input buffer 452 is read and passed this to the multiplexer 464. The method proceeds to step 508.

Step 508: Decompress Data Block

In step 508, the compressed data block read in step 506 is decompressed by the fixed rate decompression block 464 using a fixed-rate decompression scheme. The method proceeds to step 510.

Step 510: Generate Specified Values

At step 510, a specified value (which, in this embodiment, is zero) is generated by the specified value generator 462 and this is passed to the multiplexer 460. The method then proceeds to step 512.

Step 512: Output Uncompressed Block

In step 512, the uncompressed block is output by the output buffer 454. The method proceeds to step 514.

Step 514: Presence Vector Bits Remaining?

At step 514 it is determined whether any of the M-bits of the presence vector are remaining. If so, the method proceeds back to step 504 and the process is repeated until the M data blocks corresponding to the M-bits of the presence vector $V_p$ have been processed. If not, then the method proceeds back to step 502 where the next presence vector in the data stream is read and the process repeats.

This embodiment has been described in the context of decompressing a single block per clock cycle. However, the above scheme is also applicable to situations where multiple blocks are read per clock cycle. This is achieved by reading N bits from the presence vector per cycle. This means that the input buffer 452 is required to be N*M bits wide to allow for reading N bits of data per cycle, which means the section of the presence vector should also be N*M bits wide.

A further embodiment of an encoder/decoder according to the disclosure will now be described. One approach to increasing the compressibility of the data further is to apply a transform to the data prior to quantization.

Many suitable types of transformation could be used with the present disclosure. The data may be transformed, the transform may be an affine transform, a Fourier transform, or one or many levels of a wavelet transform. If one chooses a wavelet transform, it is possible to drop certain levels of wavelet coefficients, simultaneously smoothing the data and increasing compression.

The corresponding inverse transform (the composition of transform and inverse transform may be lossless or lossy) will then be performed in the decompression:
1. Expand sparse input data
2. Perform inverse transform of the data However, the following example will describe a compression/decompression scheme involving one level of wavelet decomposition. In this embodiment, blocks of low frequency data are interleaved with blocks of high frequency data. This allows for runs of zeroes in the high frequency coefficients while keeping the low frequency coefficients. If the implementation can process two or more blocks at the same time, the low frequency and high frequency coefficients are available together and can therefore be immediately processed by further stages of the pipeline.

In this embodiment, the compression is carried out by the CPU 102 streaming uncompressed data from the main memory 104. However, other arrangements may be used as required. This is not material to the present disclosure. Compression may be carried out on dedicated hardware or any other suitable hardware.

Figure 13:
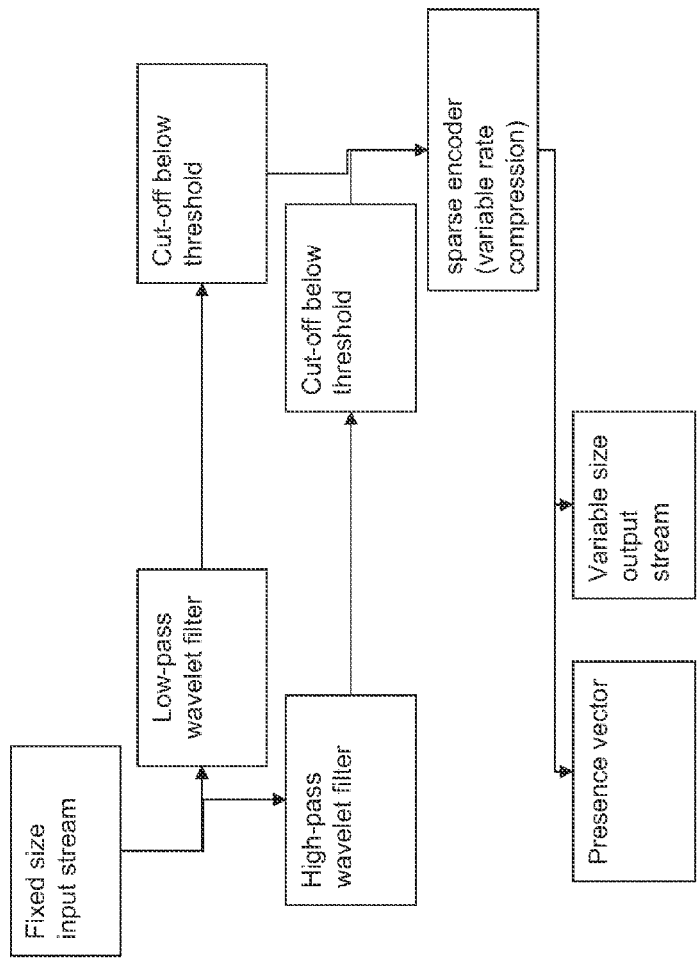
FIG. 13 is a schematic flow diagram of the general components of an encoder according to an alternative embodiment of the present disclosure.
Figure 14:
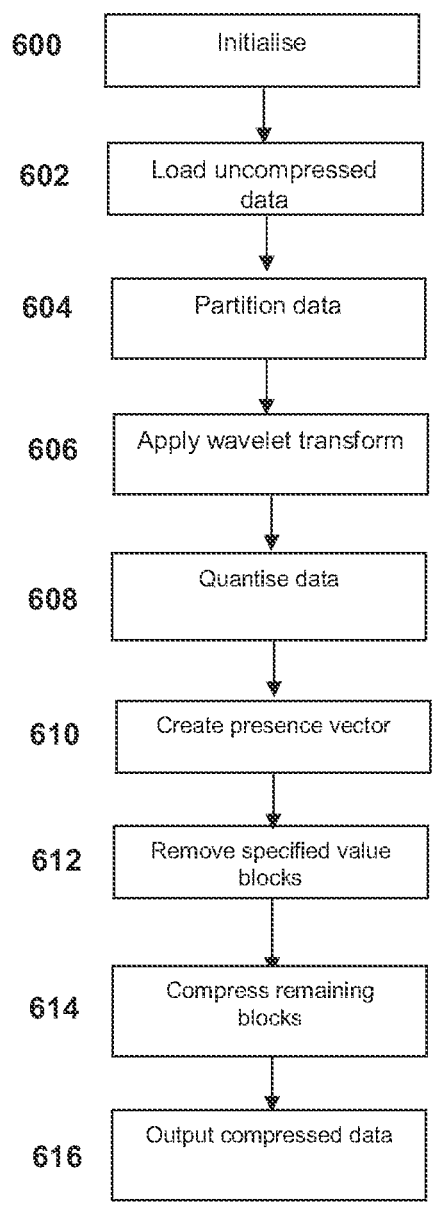
FIG. 14 is a flow chart for the method of operation of the encoder of FIG. 13.

FIGS. 13 and 14 illustrate an embodiment of an encoder.

Steps in common with the first embodiment of data compression will not be described again here in detail. Steps which differ will be described. Therefore, steps 600-602, and 612-616 will not be described in detail.

Step 600: Initialize

At step 600, the computation is initialized. At this point, the CPU 102 runs the program which initializes the numerical computation.

The method then proceeds to step 602.

Step 602: Load Uncompressed Data

At this point, the CPU 102 retrieves the uncompressed data set required for solving the necessary computation. In one example, this will be in the form of a multiplicity of sets of seismic trace data. This step corresponds to step 202 described earlier. The method then proceeds to step 604.

Step 604: Partition Data into Superblocks

The CPU 102 first partitions the data into a plurality of groups or "superblocks". A superblock may take any suitable size and, preferably, comprises a plurality of blocks which are small relative to the superblock size. For example, in one embodiment, a superblock comprises 2048 items and a block comprises 8 items. Thus, in one embodiment, a superblock comprises 256 blocks. Each superblock is compressed separately as will be described below. This approach is the same as for step 204. Once the superblocks are defined, the method then proceeds to step 606.

Step 606: Apply Wavelet Transform

In step 606, a wavelet transform is applied to the data in each superblock. A wavelet transform is particularly suitable for seismic data because wavelet compression methods are useful for representing transients. The transient elements of a seismic trace can, thus, be represented by a smaller amount of information than would be the case if some other transform, such as the more widespread discrete cosine transform, had been used.

The wavelet transform produces data coefficients which can then be compressed more easily in subsequent steps because the information is statistically concentrated in just a few coefficients.

For smooth input data, the wavelet coefficients will contain additional runs of zeroes. Wavelets also allow the possibility to choose different fixed-rate compression schemes and thresholds for different frequency sub-bands of the input data.

Once the transform has been completed, there will exist various coefficients of transformed data. However, in this embodiment, only one level of transform is described.

Step 606, therefore, involves passing the uncompressed data through a low-pass wavelet filter and through a high-pass wavelet filter as shown in FIG. 13.

Step 608: Quantize Data

Once the data is organized into groups or superblocks of a pre-defined size and the wavelet transform carried out in low pass and high pass forms, the data within the blocks is then quantized to increase the number of zeros (or, if the specified value is non-zero, the number of data items having the specified value) present.

In one embodiment, this is achieved using a thresholding function. A threshold magnitude is defined. Data blocks having values below the threshold magnitude are set to the specified value which, in this embodiment, is zero. Blocks having values above the threshold magnitude are left unchanged.

The threshold magnitude may be adjusted dynamically during encoding to achieve a desired trade-off between compression rate and data accuracy. The thresholding function is applied equally to both the low-frequency and the high frequency components of the wavelet transform.

At the end of step 608, each block can be divided into one of two categories. Either a block comprises entirely zero-value items, or a block contains one or more non-zero data items. The method then proceeds to step 610.

Step 610: Create Presence Vector

Once the quantization has been performed in step 608, in step 610 a vector is generated to encode whether each block is entirely zero, or contains at least one non-zero value. A value of 0 is assigned for entirely zero blocks, and a value of 1 otherwise. This step is identical to step 208 described previously.

The method then proceeds to step 612. Steps 612-616 are similar to steps 210-214 and will not be described further here.

By utilizing such a wavelet decomposition scheme, then blocks of low frequency data are interleaved with blocks of high frequency data. This allows for runs of zeroes in the high frequency coefficients while keeping the low frequency coefficients.

Figure 15:
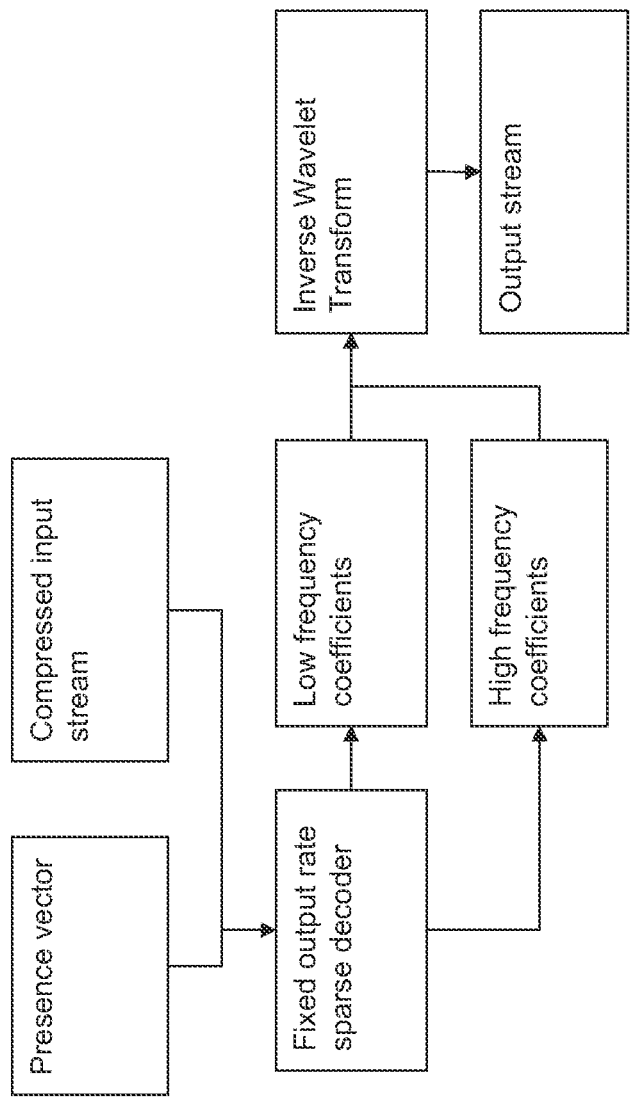
FIG. 15 is a schematic flow diagram of the general components of a decoder according to an alternative embodiment of the present disclosure for decoding data generated by the encoder of FIG. 13.

An embodiment of a decoder for decoding compressed data generated using the method above requires additional components in order to decompress the compressed and transformed data stream. FIG. 15 shows a general schematic, similar to that of FIG. 13 illustrating the process flow of the decoder.

A presence vector and a compressed input data stream are received at an input buffer as described for earlier embodiments. They may comprise separate streams, as for the first two embodiments of decoder, or may be combined into a single stream, as for the third embodiment of decoder. The data is then passed through a fixed output rate sparse decoder which is operable to separate out the low and high frequency blocks. These blocks are then passed through an inverse wavelet transform prior to generation of an output stream.

If the implementation can process two or more blocks at the same time, the low frequency and high frequency coefficients are available together and can therefore be immediately processed by further stages of the pipeline.

Variations of the above embodiments will be apparent to the skilled person. The precise configuration of hardware and software components may differ and still fall within the scope of the present disclosure. For example, whilst the present disclosure has been described with reference to FPGA architecture, this need not be so. ASIC architecture or any other processor type may be used.

As outlined above, the specified value need not necessarily be zero and may take any suitable value. Further, the specified value may be different for each superblock to aid compression. In this case, the presence vector would need to encode the value of the specified value to enable accurate decompression. This approach may have advantages in increasing the compression ratio is situations where, for example, a baseline value varies between superblocks or between seismic trace sets.

The decoders described above are shown as separate from the computational data path. However, in some embodiments they may comprise a part of the computational data path which is dedicated to decompression. However, other alternatives may be implemented; for example, the decoder may comprise a separate component on the accelerator card or may be located elsewhere on the stream processor.

One application of the method and apparatus of the described embodiment is performing seismic trace processing calculations on a seismic survey dataset. One such calculation is Surface Related Multiple Elimination (SRME).

SRME involves computing a prediction of waves that have been recorded as part of a dataset which originated not at the original source point but instead are a "multiple"—an original wave which has returned to the surface and bounced back into the earth mimicking the effects of another wave source. Multiples complicate later stages of seismic processing to produce an image of the subsurface and so it is often desirable to remove these multiples by computing the predicted multiples for each data trace and then subtracting it from the original trace.

Computing the predicted multiples involves convolving many pairs of seismic data traces and summing the results. These traces must be stored in memory to achieve reasonable performance, however seismic surveys are large and storing even a partial window into a survey requires very high memory capacities. The present disclosure can multiply the effective memory capacity of an accelerator by 3-5× times, making it practical to hold enough data to compute SRME without being limited by disk performance, and also reduces the amount of data that must be transferred between memory, disk and memories on other computing devices. Traces are read from the input data set many times but are not updated until the end of the computation, meaning that efficient decompression is more important that compression performance.

While this is presented as an example, the skilled person would be readily aware of other numerical calculations which could be performed using the method and apparatus according to the disclosure.

Further, the accelerator need not be located on a card attached to a bus. The accelerator may, indeed, in some embodiments form part of a CPU or other processor within a computing system, or may be located on a motherboard with the CPU. Additionally, as discussed, multiple accelerator cards may be provided. Each card may be connected in parallel or in series and may be capable of communicating with the CPU or with other cards via the interconnect or other connection.

Whilst the above embodiment has been described with reference to an FPGA stream processor arrangement, the skilled person would be readily aware of alternative configurations which could be used. For example, a CPU architecture with corresponding local memory could be used.

Embodiments of the present disclosure have been described with particular reference to the examples illustrated. While specific examples are shown in the drawings and are herein described in detail, it should be understood, however, that the drawings and detailed description are not intended to limit the disclosure to the particular form disclosed. It will be appreciated that variations and modifications may be made to the examples described within the scope of the present disclosure.

From the description provided herein, those skilled in the art are readily able to combine software created as described with appropriate general-purpose or special-purpose computer hardware to create a computer system and/or computer sub-components in accordance with the various embodiments, to create a computer system and/or computer sub-components for carrying out the methods of the various embodiments and/or to create a non-transitory computer-readable media (i.e., not a carrier wave) that stores a software program to implement the method aspects of the various embodiments.

The above discussion is meant to be illustrative of certain principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method of data compression, the method comprising:
   obtaining a data set comprising a sequence of fixed-length data blocks, each data block comprising the same predetermined number of data items;
   partitioning said data set into one or more fixed-length groups each comprising the same number of data blocks; and
   performing data compression on one or more groups of data blocks by:
   associating a control data item with each of said blocks, said control data item having a value dependent upon whether a block contains entirely data items having the same specified value or whether a block contains at least one data item having a value different from said specified value;
   generating a control vector comprising the control data items assigned to each of said blocks within a group;
   removing data blocks comprising entirely data items having said specified value;
   compressing data blocks comprising at least one data item having a value different from said specified value using a fixed-rate compression scheme; and
   providing a compressed data stream comprising said compressed data blocks; and
   providing an associated control vector stream to enable control of said compressed data stream.

2. A method according to claim 1, further comprising, prior to said step of associating, the step of:
   quantising said data items to increase the number of data items having said specified value.

3. A method according to claim 2, wherein the step of quantising comprises applying a threshold to said data items within each of said blocks, wherein data items below said threshold are set to said specified value and data items at or above said threshold remain unchanged.

4. A method according to claim 3, wherein said threshold is dynamically variable for different blocks and/or groups.

5. A method according to claim 1, wherein prior to said step of associating, the method further comprises:
   applying a transform to data items in the data set.

6. A method according to claim 5, wherein said transform comprises a wavelet transform.

7. A method according to claim 1, wherein each group of blocks is compressed separately and has a unique vector associated therewith.

8. A method according to claim 1, wherein the compressed data stream and control vector comprise separate data streams.

9. A method according to claim 1, wherein the compressed data stream and control vector stream are combined.

10. A method according to claim 1, wherein the number of data items in a group is large compared to the number of data items in a data block.

11. A method according to claim 1, wherein said specified value is zero.

12. An encoder for data compression, the encoder being operable to:
- obtain a data set comprising a sequence of fixed-length data blocks, each data block comprising the same predetermined number of data items;
- partition said data set into one or more fixed-length groups each comprising the same number of data blocks; and
- perform data compression on one or more groups of data blocks, the encoder being operable to perform data compression by:
  - associating a control data item with each of said blocks, said control data item having a value dependent upon whether a block contains entirely data items having the same specified value or whether a block contains at least one data item having a value different from said specified value;
  - generating a control vector comprising the control data items assigned to each of said blocks within a group;
  - removing data blocks comprising entirely data items having said specified value;
  - compressing data blocks comprising at least one data item having a value different from said specified value using a fixed-rate compression scheme;
  - providing a compressed data stream comprising said compressed data blocks; and
  - providing an associated control vector stream to enable control of said compressed data stream.

13. A method of data decompression, the method comprising:
- obtaining a compressed data stream derived from an uncompressed data set comprising a sequence of fixed-length data blocks each having the same predetermined number of data items, said compressed data stream comprising one or more compressed data blocks, each compressed data block having said predetermined number of data items;
- obtaining an associated control vector stream to enable control of said compressed data stream, said control vector stream comprising a sequence of control data items each corresponding to a data block of said uncompressed data stream;
- reading at least one control data item of said control vector stream and, in dependence upon the value of control data item, for each control data item either:
  - generating a data block comprising said predetermined number of data items, each of said data items having the same specified value; or
  - decompressing the compressed data block corresponding to said read data control item; and then:
    - outputting said generated or decompressed data block as part of a decompressed data stream; and
    - repeating the above step of reading for subsequent control data items.

14. A method according to claim 13, wherein a single control data item is read and a single uncompressed block is output per clock cycle.

15. A method according to claim 13, wherein N control data items are read and N uncompressed blocks are output per clock cycle.

16. A method according to claim 15, where N is an integer.

17. A method according to claim 15, wherein said step of decompressing comprises decompressing a plurality of data blocks in parallel.

18. A method according to claim 17, wherein said step of decompressing further comprises moving one or more decompressed data blocks into a buffer for utilisation in a subsequent clock cycle.

19. A method according to claim 13, wherein the compressed data stream and the control vector stream are obtained separately.

20. A method according to claim 13, wherein the compressed data stream and the control vector stream are obtained in a combined stream, and the method further comprises, prior to said step of reading, the step of:
- extracting the control vector stream from said combined stream.

21. A method according to claim 20, wherein said step of extracting comprises extracting the number of control data items equal to the number of data items in a block.

22. A method according to claim 13, wherein said specified value is zero.

23. A decoder for data decompression, the decoder being operable to:
- obtain a compressed data stream derived from an uncompressed data set comprising a sequence of fixed-length data blocks each having the same predetermined number of data items, said compressed data stream comprising one or more compressed fixed-length data blocks, each data block comprising said predetermined number of data items and said compressed data stream being obtained from an uncompressed data set;
- obtain an associated control vector stream to enable control of said compressed data stream, said control vector stream comprising a sequence of control data items each corresponding to a data block of said uncompressed data stream;
- read at least one control data item of said control vector stream and, in dependence upon the value of control data item, for each control data item either:
  - generate a data block comprising said predetermined number of data items, each of said data items having the same specified value; or
  - decompress the compressed data block corresponding to said read data control item; and then:
    - output said generated or decompressed data block as part of a decompressed data stream; and
    - repeat the above step of reading for subsequent control data items.

24. A decoder according to claim 23, implemented on a Field Programmable Gate Array or an Application Specific Integrated Circuit.

25. A non-transitory computer-readable medium having stored thereon a computer program executable by a programmable processing apparatus, comprising one or more software portions for performing the steps of claim 1.

26. A non-transitory computer-readable medium having stored thereon a computer program executable by a programmable processing apparatus, comprising one or more software portions for performing the steps of claim 13.

* * * * *